(12) United States Patent
Ruppel et al.

(10) Patent No.: US 11,692,821 B2
(45) Date of Patent: Jul. 4, 2023

(54) INCLINATION SENSOR SYSTEM

(71) Applicant: MOBA Mobile Automation AG, Limburg (DE)

(72) Inventors: Jörg Ruppel, Limburg (DE); Dominik Becher, Limburg (DE); Boris Zils, Limburg (DE)

(73) Assignee: MOBA MOBILE AUTOMATION AG, Limburg (DE)

( * ) Notice: Subject to any disclaimer, the term of this patent is extended or adjusted under 35 U.S.C. 154(b) by 624 days.

(21) Appl. No.: 16/797,077

(22) Filed: Feb. 21, 2020

(65) Prior Publication Data

US 2020/0191566 A1 Jun. 18, 2020

Related U.S. Application Data

(63) Continuation of application No. PCT/EP2018/072766, filed on Aug. 23, 2018.

(30) Foreign Application Priority Data

Aug. 23, 2017 (EP) ..................................... 17187589

(51) Int. Cl.
*G01C 9/08* (2006.01)
*G01C 9/06* (2006.01)
*B81B 7/02* (2006.01)

(52) U.S. Cl.
CPC .................. *G01C 9/08* (2013.01); *B81B 7/02* (2013.01); *G01C 9/06* (2013.01); *B81B 2201/0292* (2013.01)

(58) Field of Classification Search
CPC . B81B 7/02; B81B 2201/0292; B66C 23/905; B66F 17/006; G01C 9/08; G01C 9/06
See application file for complete search history.

(56) References Cited

U.S. PATENT DOCUMENTS 8,727,379 B2 * 5/2014 Goeggelmann ......... B66C 23/80
280/763.1
9,020,776 B2 * 4/2015 Friend ...................... G01C 9/08
702/96

(Continued)

FOREIGN PATENT DOCUMENTS

CN  101963502 A  2/2011
CN  102032899 A  4/2011

(Continued)

OTHER PUBLICATIONS

Official Communication issued in International Patent Application No. PCT/EP2018/072766, dated Mar. 5, 2020.

(Continued)

*Primary Examiner* — Yaritza Guadalupe-McCall
(74) *Attorney, Agent, or Firm* — Keating & Bennett, LLP

(57) ABSTRACT

An inclination sensor system for a mobile work machine includes a MEMS inclination sensor and a further inclination sensor of a different type and a fusion device. The inclination sensor is configured to output a first inclination signal on the basis of an inclination that exists at the inclination sensor. The further inclination sensor is configured to output a second inclination signal on the basis of the inclination that exists at the further inclination sensor. The fusion device is configured to calculate a corrected inclination signal on the basis of the first and second inclination signals and to output same as the corrected inclination signal.

21 Claims, 6 Drawing Sheets

(56) References Cited

U.S. PATENT DOCUMENTS

| | | | |
|---|---|---|---|
| 9,151,013 B2* | 10/2015 | Glitza | E02F 9/2037 |
| 9,840,403 B2* | 12/2017 | Iotti | B66F 9/24 |
| 10,807,851 B2* | 10/2020 | Zils | B66F 11/044 |
| 2011/0067250 A1 | 3/2011 | Kludas et al. | |
| 2011/0313718 A1 | 12/2011 | Wissmann et al. | |
| 2012/0099955 A1* | 4/2012 | Glitza | E02F 3/845 |
| | | | 414/687 |
| 2013/0277954 A1* | 10/2013 | Goeggelmann | E04G 21/04 |
| | | | 280/763.1 |
| 2014/0372074 A1 | 12/2014 | Dribinsky et al. | |
| 2016/0222946 A1* | 8/2016 | Krings | G01P 21/00 |
| 2017/0217746 A1* | 8/2017 | Zils | G01C 9/02 |
| 2020/0191566 A1* | 6/2020 | Ruppel | B81B 7/02 |

FOREIGN PATENT DOCUMENTS

| | | |
|---|---|---|
| CN | 203529822 U | 4/2014 |
| CN | 105378428 A | 3/2016 |
| DE | 42 43 978 C1 | 1/1994 |
| DE | 100 32 423 A1 | 1/2002 |
| DE | 20 2007 015 532 U1 | 4/2009 |
| EP | 1 528 357 A2 | 5/2005 |
| EP | 2 386 000 A4 | 1/2013 |
| JP | 2001-097697 A | 4/2001 |
| WO | 2010/080941 A2 | 7/2010 |

OTHER PUBLICATIONS

Official Communication issued in corresponding Chinese Patent Application No. 201880067198.1, dated Jul. 27, 2021.

\* cited by examiner

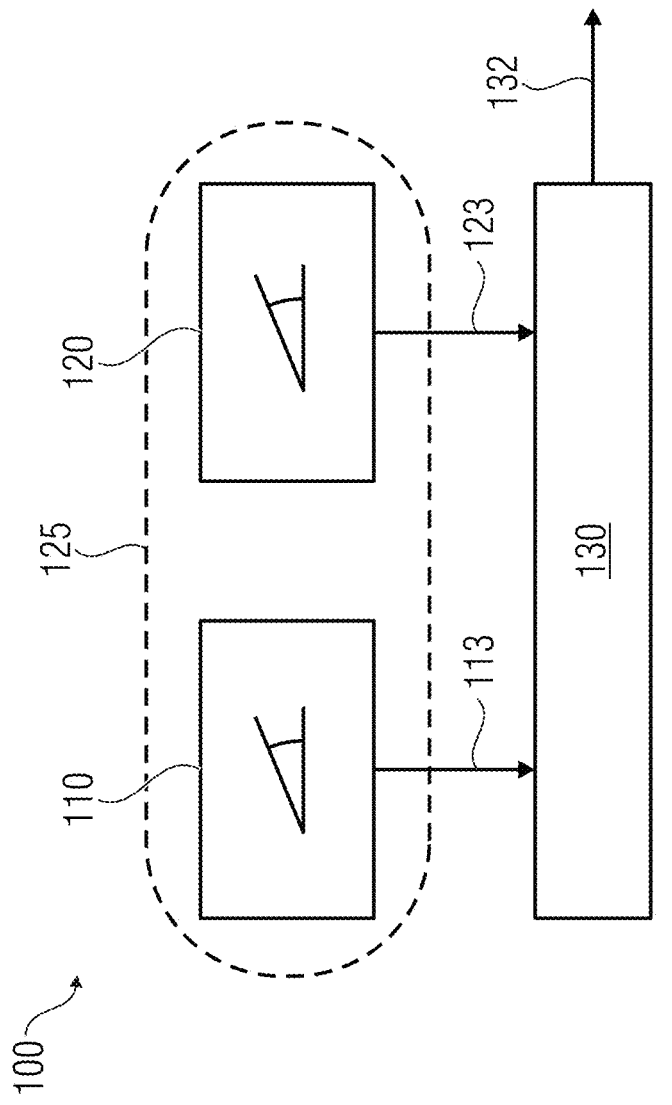

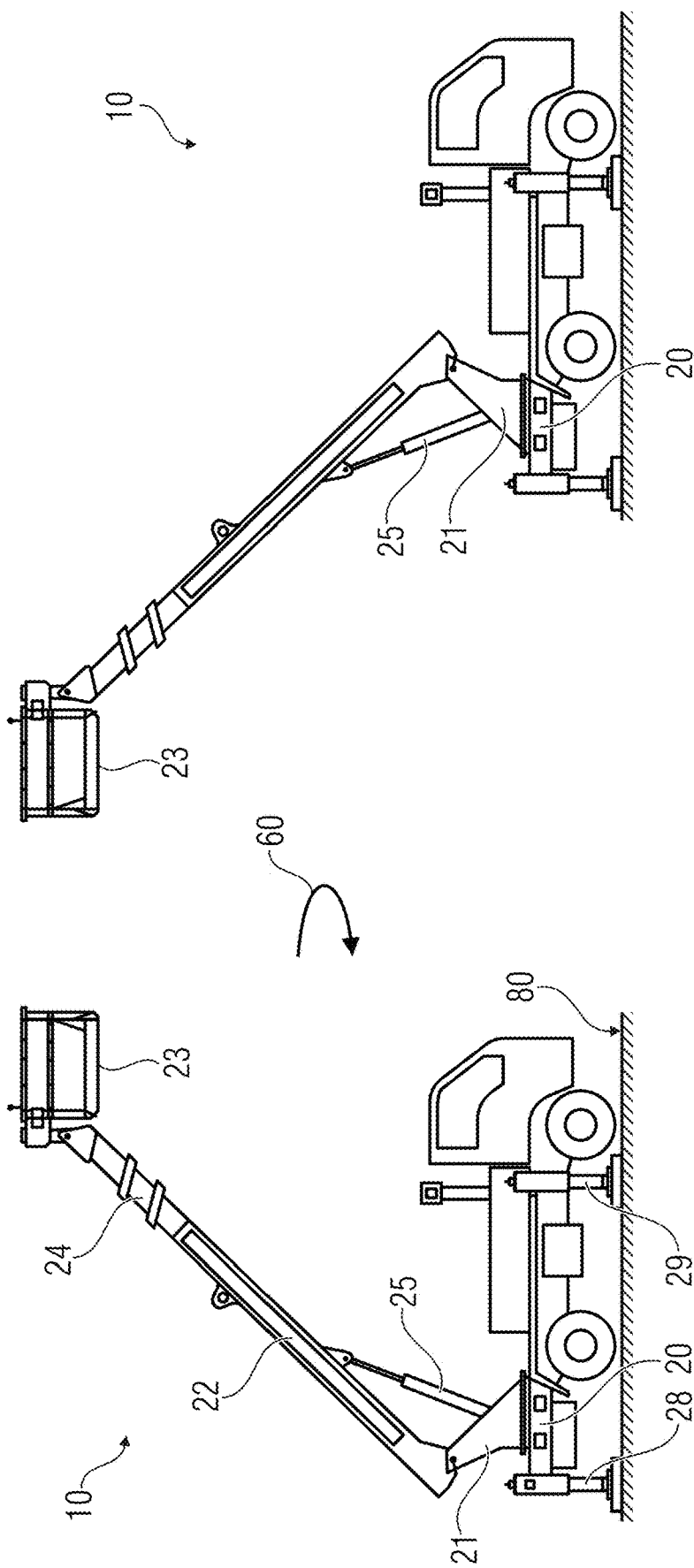

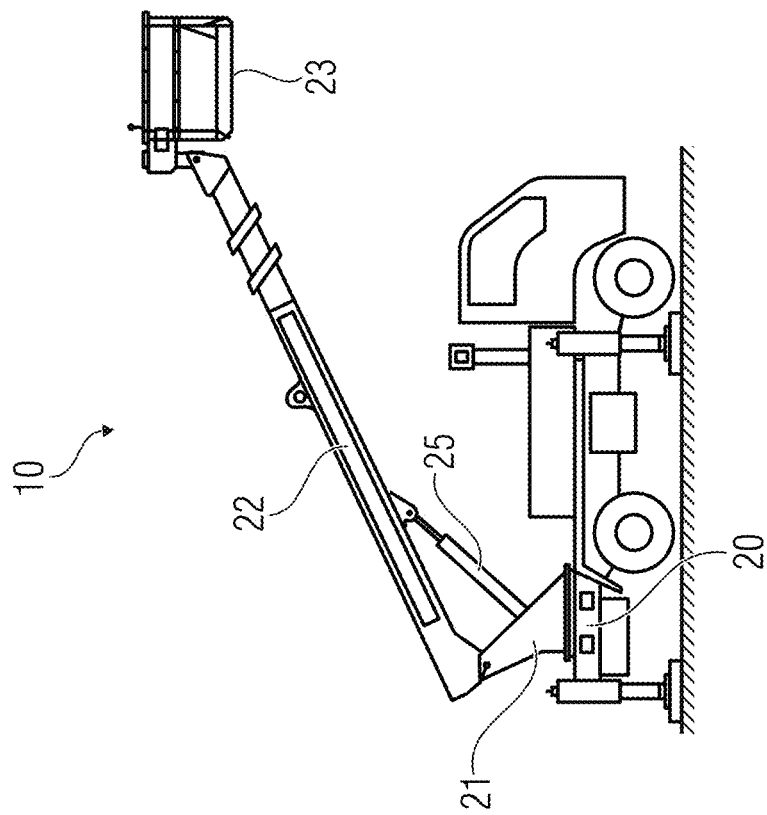
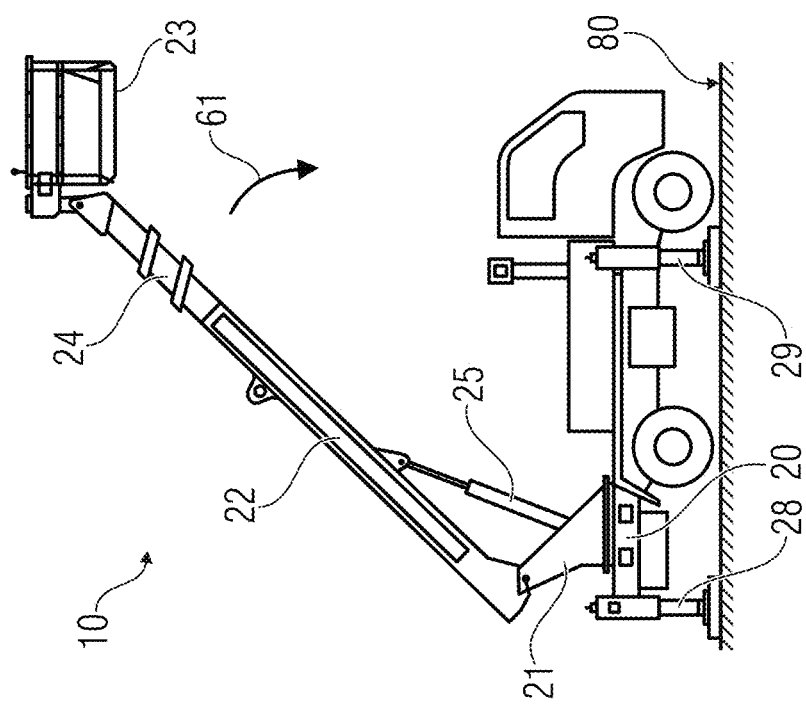
Fig. 2c
Fig. 2d

INCLINATION SENSOR SYSTEM

CROSS-REFERENCES TO RELATED APPLICATIONS

This application is a continuation of copending International Application No. PCT/EP2018/072766, filed Aug. 23, 2018, which is incorporated herein by reference in its entirety, and additionally claims priority from European Application No. EP 17187589.1, filed Aug. 23, 2017, which is incorporated herein by reference in its entirety.

Embodiments of the present invention relate to an inclination sensor system for a mobile work machine and to a corresponding inclination measurement method. Generally, the invention lies in the field of mobile work machines, for example an elevating platform or a mobile derrick. Advantageous embodiments relate to a sensor system for position levelling of a structure that is adjustably and/or rotatably arranged on the chassis of the mobile work machine and comprises a hydraulically adjustable machine part, e.g., a telescopic jib.

BACKGROUND OF THE INVENTION

The present invention essentially deals with a problem that has occurred at an elevating platform in practice. Such an elevating platform is known from DE 100 32 423 A1 and describes a moveable elevating platform having a carriage and a jib structure arranged on the carriage, the jib structure being moveably attached to a rotating tower, and the rotating tower being rotatably arranged at the carriage by means of a rotation gear. The rotating tower consists of a rotary table and a leveling tower which has the jib structure moveably attached to it, the levelling tower and the rotary table being connected via a rotation axis, and the levelling tower having at least one inclination sensor arranged thereat for controlling at least one lifting and lowering device, so that the levelling tower is held, independently of an inclination of the carriage and/or of the rotary table, in an approximately horizontal alignment by means of the lifting and lowering device.

As far as the inclination sensor is concerned, DE 100 32 423 A1 does not reveal anything about the sensor technology used. However, it is generally known that inclination sensors in the application described nowadays contain so-called micromechanical MEMS sensor elements (micro-electromechanical systems) since the latter exhibit several advantages such as high accuracy and small insulation size, for example. With MEMS sensor elements, one essentially distinguishes between so-called surface- and bulk-micromachined-sensors. In addition to several technical parameters and different internal designs, the two above-mentioned types of MEMS sensor elements clearly differ in terms of their respective prices. For example, the known bulk-micromachined MEMS sensors are filled with a gas, which is why they can hardly or not at all be made to resonate since the natural frequency (resonant frequency) of the sensor element is clearly above the cutoff frequency thereof. As compared to surface-micromachined MEMS sensors, bulk-micromachined MEMS sensors are about 3 times more expensive, however. Therefore, to save cost, MEMS sensors with surface-micromachined technology are often used in inclination sensors.

For crane/jib monitoring, a thermodynamic inclination and acceleration sensor is further known from DE 42 43 978 C1. Said sensor elements are low in price but are, as compared to MEMS sensors, substantially less accurate and more sensitive to changes in the ambient temperature, so that this type of sensor nowadays is typically not used in the application described. With regard to utilization in the field of mobile work machines, there is therefore a need to improve a sensor system for position levelling accordingly.

SUMMARY

According to an embodiment, an inclination sensor system for a mobile work machine in the form of an elevating platform or of a crane or a turntable ladder may have: a MEMS inclination sensor configured to output a first inclination signal on the basis of an inclination that exists at the inclination sensor; a further inclination sensor of a different type that is configured to output a second inclination signal on the basis of the inclination that exists at the further inclination sensor; and a fusion device configured to determine or calculate a corrected inclination on the basis of the first and second inclination signals and to output same as the corrected inclination signal.

According to another embodiment, a work machine may have an inventive inclination sensor system.

According to another embodiment, a method of measuring inclination in a mobile work machine may have the steps of: determining an inclination that exists at the inclination sensor by means of a MEMS inclination sensor, and outputting a first inclination signal as a function of said inclination; determining the inclination that exists at the inclination sensor by means of a further inclination sensor of a different type, and outputting a second inclination signal as a function of the inclination that exists at the inclination sensor; and determining or calculating a corrected inclination on the basis of the first and second inclination signals so as to output a corrected inclination signal.

According to another embodiment, a non-transitory digital storage medium may have a computer program stored thereon to perform the inventive method, when said computer program is run by a computer.

According to another embodiment, an inclination sensor system for a mobile work machine in the form of an elevating platform or of a crane or a turntable ladder may have: a MEMS inclination sensor configured to output a first inclination signal on the basis of an inclination that exists at the inclination sensor; a further inclination sensor of a different type having a different sensor principle that is configured to output a second inclination signal on the basis of the inclination that exists at the further inclination sensor; and a fusion device configured to determine or calculate a corrected inclination on the basis of the first and second inclination signals and to output same as the corrected inclination signal; wherein the fusion device is configured to compare the first and second inclination signals and to output the first inclination signal as the corrected inclination signal in the event that there are no deviations; and/or wherein the fusion device is configured to compare the first and second inclination signals and to output the second inclination signal as the corrected inclination signal in the event that there are deviations.

According to yet another embodiment, a work machine may have an inventive inclination sensor system.

According to another embodiment, a work machine may have an inclination sensor system, said work machine being an elevating platform or a crane or a turntable ladder, the inclination sensor system being arranged at a superstructure, a jib, a telescopic jib, or a working platform, wherein said inclination sensor system may have: a MEMS inclination sensor configured to output a first inclination signal on the basis of an inclination that exists at the inclination sensor; a further inclination sensor of a different type having a different sensor principle that is configured to output a second inclination signal on the basis of the inclination that exists at the further inclination sensor; and a fusion device configured to determine or calculate a corrected inclination on the basis of the first and second inclination signals and to output same as the corrected inclination signal.

According to another embodiment, a method of measuring inclination in a mobile work machine may have the steps of: determining an inclination that exists at the inclination sensor by means of a MEMS inclination sensor, and outputting a first inclination signal as a function of said inclination; determining the inclination that exists at the inclination sensor by means of a further inclination sensor of a different type having a different sensor principle, and outputting a second inclination signal as a function of the inclination that exists at the inclination sensor; determining or calculating a corrected inclination on the basis of the first and second inclination signals so as to output a corrected inclination signal; and comparing the first and second inclination signals and outputting the first inclination signal as the corrected inclination signal in the event that there are no deviations; and/or comparing the first and second inclination signals and outputting the second inclination signal as the corrected inclination signal in the event that there are deviations.

According to another embodiment, a non-transitory digital storage medium may have a computer program stored thereon to perform the inventive methods, when said computer program is run by a computer.

Embodiments of the present invention provide an inclination sensor system comprising a MEMS inclination sensor, in particular a so-called surface-micromachined MEMS inclination sensor (MEMS-based inclination sensor, manufactured by means of surface technologies), a further inclination sensor such as a thermodynamic inclination sensor, for example, as well as a fusion device. The MEMS inclination sensor is configured to output a first inclination signal on the basis of an inclination that exists at the inclination sensor. The further inclination sensor is of a different type and is configured to output a second inclination signal on the basis of the inclination that exists at the inclination sensor. The fusion device is configured to calculate a corrected inclination on the basis of the first and second inclination signals and to output same as the corrected inclination signal.

Embodiments of the present invention are based on the finding that thermodynamic sensor elements are indeed less accurate than MEMS sensor elements but, above all, they are also less sensitive toward the mechanical vibrations and/or interferences described at the outset, which are caused by problematic transmission at an elevating platform. This gave rise to the idea to combine two different sensor technologies within one inclination sensor system on the basis of at least one MEMS inclination sensor and to thus detect, by means of, e.g., a thermodynamic sensor, whether or not the MEMS inclination sensor provides a faulty measurement signal because of mechanical vibrations and/or interferences (as was described above). By fusing both sensors and/or the sensor signals, the advantages of both technologies are solved, in particular for the very specific problem of mechanical vibrations, which lie within the low kHz range, in particular between 3 and 4 kHz. By using two different sensor technologies, the present invention advantageously provides a complete, redundant and diverse inclination system.

As was already alluded to above, the MEMS inclination sensor is advantageously manufactured on the basis of surface MEMS technologies. With such a type of manufacturing, one or more layers are grown onto or applied to the substrate, which layers have the MEMS structure introduced therein. Thus, a MEMS inclination sensor thus manufactured includes a substrate, on the surface of which the MEMS structures are formed. Such MEMS sensors can be produced at low cost and exhibit a high level of accuracy. In accordance with the further embodiments, the further inclination sensor of the other type is a so-called thermodynamic inclination sensor. A thermodynamic inclination sensor can also be produced at low cost and exhibits increased robustness to interferences in the case of vibrations as compared to the MEMS inclination sensor (based on surface MEMS technologies) explained above.

In said fusion, there are different approaches of how the two inclination signals may be combined with each other. In accordance with an embodiment, for example, the first inclination signal is used if there is no deviation, or if there is a constant deviation, with two inclination signals. In accordance with another embodiment, the second inclination signal may be used in the case of a deviation. In accordance with embodiments, the fusion device may be configured to verify the first inclination signal by means of an FFT (fast Fourier transformation) and to output the second inclination signal as the corrected inclination signal if a deviation within the frequency spectrum is detected or if a predetermined level of one or more frequency components is exceeded. In accordance with further embodiments, the fusion device may be configured to verify the time course of, in particular, the first inclination signal with regard to discontinuities and to output the second inclination signal as the corrected inclination signal in case of discontinuities. In accordance with embodiments, discontinuities may also be reflected by a so-called "value peak" characterized by a signal change by at least 0.1%, 0.5%, 2%, 5%, or 10% as compared to the previous level within a time period of less than 100 ms, 500 ms, or less than 1 second. In the event of a value peak, the second inclination signal will be used as the corrected inclination signal. In accordance with a further embodiment, one may also verify, as evidence of a falsified first inclination signal, the time course with regard to a rising first inclination signal up to a formation of a plateau at a maximum value for the first inclination signal so as to then, in the event of such a characteristic curve, output the second inclination signal as the corrected inclination signal.

In accordance with a further embodiment, the fusion device may be configured to observe the time course of the first and/or second inclination signal(s) with regard to a drift so as to compensate for any offset error and/or gain error that may result from the drift, or to output the sensor signal which has no drift as the corrected inclination signal. In accordance with a further embodiment, the sensor system may include one or more temperature sensors for monitoring the ambient temperature of the MEMS inclination sensor and/or of the further inclination sensor, the fusion device being configured to determine the inclination signal while taking into account one or more temperature values of the one or more temperature sensors and/or to correct the first, the second, and/or the corrected inclination signal as a function of the one or more temperature values.

In accordance with a further embodiment, a work machine such as an elevating platform, a (fire brigade) turntable ladder or a crane, for example, which comprises such an inclination sensor. The inclination sensor may be arranged, for example, at the superstructure, jib, telescopic jib or the working platform.

A further embodiment provides a corresponding method comprising the following steps:

measuring an existing inclination by means of a MEMS inclination sensor so as to obtain a first inclination signal, and measuring by means of an inclination sensor of a different type so as to obtain a second inclination signal, and calculating a corrected inclination signal on the basis of the first and second inclination signals so as to output a corrected inclination signal. This method may also be configured, in accordance with further embodiments, with the help of a computer.

BRIEF DESCRIPTION OF THE DRAWINGS

Embodiments of the present invention will be detailed subsequently referring to the appended drawings, in which:

FIG. 1 shows a schematic block diagram of an inclination sensor in accordance with an embodiment;

FIGS. 2a-2d show schematic representations of an elevating platform with different movements which may have negative effects on inclination signals;

DETAILED DESCRIPTION OF THE INVENTION

Figure 3:
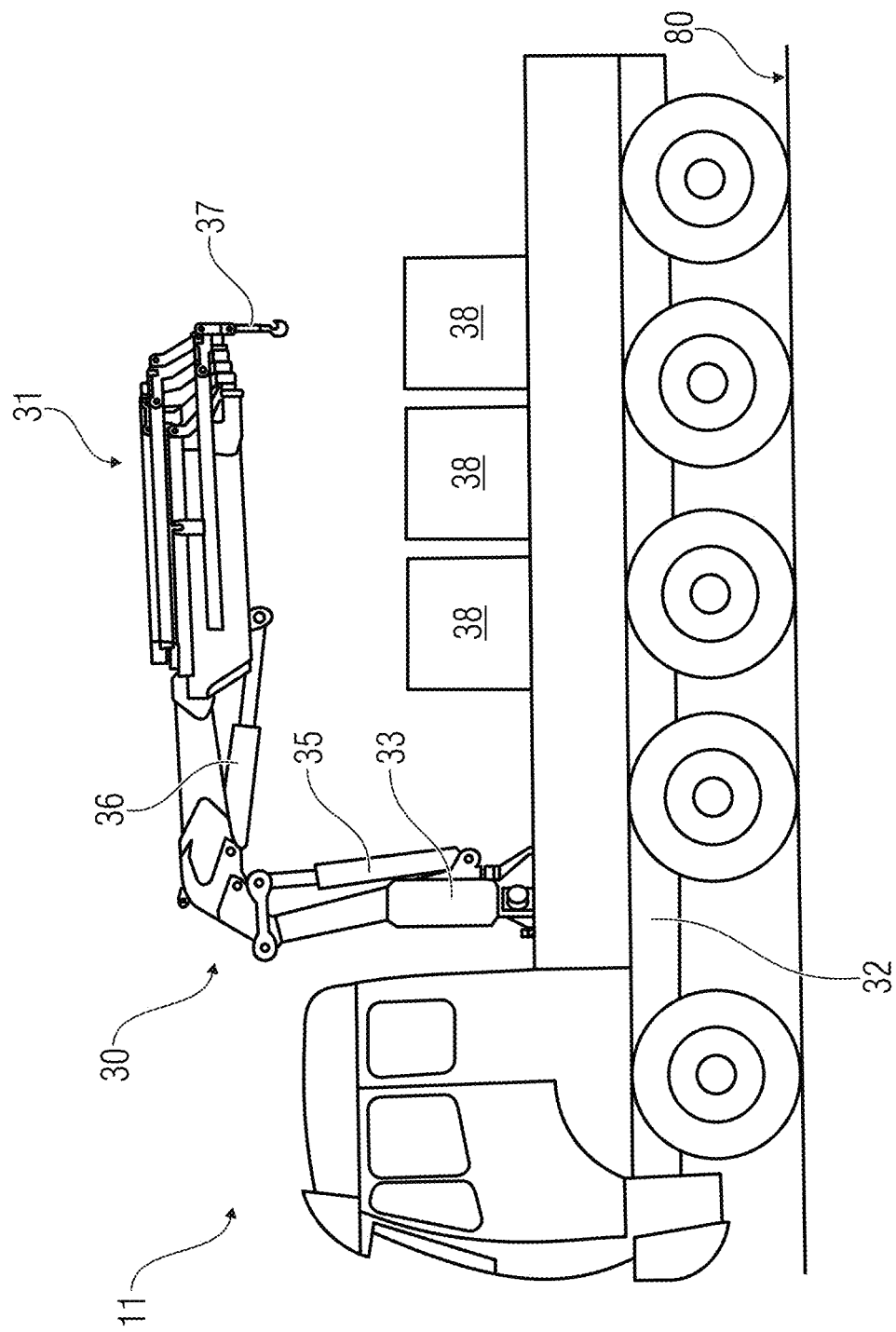
FIGS. 3 and 4 show further schematic representations of work machines where falsifications of the inclination signal may occur as a result of movements.

Before embodiments of the present invention will be explained in detail with reference to the figures, it shall be noted that identical elements and structures are provided with identical reference numerals, so that their descriptions are mutually applicable and/or exchangeable.

FIG. 1 shows a sensor system 100 used for inclination measurement and/or for measurement for position levelling. Said sensor system 100 includes a MEMS sensor 110, a thermodynamic sensor 120, or generally, an inclination sensor of a different type. Also, the sensor system 110 additionally also includes a calculating unit 130. The three units 110, 120 and 130 and/or at least the two sensors 110 and 120 are coupled to one another in their respective movements, e.g., via a shared housing 125, so that both sensors 110 and 120 undergo the same inclination as a function of the movement of the shared housing 125 and/or as a function of the shared movement. In this sense, both inclination sensors 110 and 120 should, irrespectively of each other, determine their respective inclinations and/or position with regard to gravity, and output comparable inclination signals 113 and 123.

MEMS inclination sensors, here inclination sensor 110, frequently exhibit the disadvantage that external influences such as vibrations or interferences may act on the sensor and may impair its behavior and heavily falsify the measurement result. As was found in practice with a vibration analyzer, mechanical vibrations and/or interferences are generated, by the rotary drive, at an elevating platform as described above, specifically whenever the rotating tower is rotated in relation to the carriage. As measurements have shown, said mechanical vibrations and/or interferences lie within the lower kHz range, i.e., approximately within a range from 3 to 4 kHz. It is via the housing 125 of the inclination sensor, which is firmly connected to the rotating and/or levelling tower, that said mechanical vibrations and/or interferences act upon the MEMS sensor elements 110 and cause them to self-oscillate (to resonate), so that deviations in the measured values occur without there being an actual change in inclination. For example, during the influence of the vibration, the measurement signal of the MEMS sensor that has been output slowly rises up to the upper signal margin, where it stays for such time until the rotation of the rotating tower is ended and, consequently, the effect of the vibration decreases.

The problem which has been observed and illustrated and is caused by the rotary drive is to be put down to the so-called slip-stick effect, i.e., the occurrence of vibrations when solid bodies which are moved counter to one another are rubbed and/or stick-slipped in relation to one another. This effect can also be observed with hydraulic cylinders as are also used with elevating platforms or mobile loading cranes. Upon aging of the cylinder and of the sealings, jerking arises when the cylinder is moved (retracting and/or extending of the push rod and/or piston rod), as a result of which the mechanical system is excited to perform broadband vibrations. Said vibrations are then transferred to all of the components arranged at the mechanical system, such as a sensor system for position leveling, which is arranged at the rotating tower or at the telescopic arm of an elevating platform or of a mobile loading crane. Thus, the above-described mechanical vibrations and/or interferences also arise, e.g., when the work cage of an elevating platform is lifted up or lowered down or when the telescopic arm of a mobile loading crane is retracted and extended.

On the basis of these disadvantages of the sensor 110, the sensor 120, such as the thermodynamic sensor 120, is supplemented, which, using a different sensor principle as its basis, is not interfered with by the slip-stick effect. As was already mentioned at the outset, thermodynamic inclination and/or acceleration sensors are suitable for this purpose.

Since there are now two sensor signals 113 and 123, these may be evaluated, by means of the calculating device 130, in terms of whether or not the sensor signal 113, which is advantageous in terms of accuracy, is faulty. To this end, several possibilities will be described below; the invention leaves it up to the user to either use only one of these possibilities or to combine several possibilities with one another.

One of these possibilities consists in verifying the sensor signal 113 by means of FFT (fast Fourier transformation). If one can see, from the frequency spectrum, that the deviation results from an external interference rather than from a change in the angle, the calculating unit 130 may output, as the corrected sensor signal 132, the sensor signal 123 instead of the sensor signal 113 (more precise signal). As soon as the output signal (sensor signal 113) of the MEMS sensor 110 is overridden, signal distortions will occur. In a heavily low-pass filtered sensor signal 113, said signal distortions cause an inclination error (offset). However, the actual cause of the change in inclination can no longer be determined from this signal, i.e., it cannot be determined whether what is at hand is an ordinary change in the inclination of the sensor system 100 or a signal distortion caused by external influences such as vibrations or interferences which act upon the sensor system 100. Therefore, the sensor signal 113 should contain all of the frequency components of the transmission range of the MEMS sensor 110 in a manner that is unfiltered to a maximum extent. Such verification by means of FFT may be performed either by means of software or by means of hardware, i.e., advantageously by a microcontroller within the calculating unit 130. With a correspondingly high sampling rate, overriding of the MEMS sensor 110 can be detected with each individual value by means of software, and thus one may assess whether or not the sensor signal 113 is faulty. If only a small sampling rate is made available by the hardware (micro controller and peripheral devices), the unfiltered sensor signal 113 may be monitored, by using a comparator, in terms of whether or not a predetermined level of one or more frequency components is exceeded (so-called peak detector). The output signal of the peak detector may cause an interruption in the calculating unit 130, for example, which interruption in turn is used for assessing whether or not the sensor signal 113 is faulty.

It would also be feasible to compare sensor signals 113 and 123. For example, if the sensor signal 113 deviates from an identical or comparable level with regard to the sensor signal 123, or deviates therefrom after a short time, one may assume that said deviation results from an external interference rather than from a change in angle, so that subsequently, the calculating unit 130 will output, as the corrected sensor signal 132, the sensor signal 123 instead of the sensor signal 113 (more accurate signal). In this context it would also be possible for the calculating unit 130 to determine, by comparing sensor signals 113 and 123, a deviation of, e.g., +/−0.1 degrees or +/−0.2 degrees of inclination, i.e., the sensor signal 113 of the MEMS sensor 110, which is actually advantageous, deviates from the sensor signal 133 by, e.g., an inclination of +/−0.1 degrees or +/−0.2 degrees. This very fact might cause the calculating unit 130 to output and/or forward the second sensor signal 123 as the corrected sensor signal 132.

In accordance with embodiments, an interference will be detected, e.g., when discontinuities occur in the course of the sensor signal 113. Such discontinuities may be reflected by a temporary deviation (at least 0.1%, 0.5%, 2%, 5%, or 10% within a time period of less than 100 ms, 500 ms, or less than 1 second) or by a constant increase up to a plateau at the sensor maximum. Also in the event of a thus detected abnormal behavior of the sensor 110, the calculating unit 130 may then forward the sensor signal 123 as the corrected sensor signal 132.

However, in all of the evaluations described above it is to be noted that the measurement results of the MEMS sensor 110 and, in particular, of the thermodynamic sensor 120 are dependent on the temperature, so that a decision as to which of the two sensor signals 113 and 123 will be output and/or forwarded as the corrected sensor signal 132 by the calculating unit 130 cannot be made just like that. Here, too a sensor drift (offset drift) of the, in particular, thermodynamic, sensor 120 is to be taken into account by the calculating unit 130 in making a decision as to which of the two sensor signals 113 and 123 can be output and/or forwarded as the corrected sensor signal 132. The calculating unit 130 may therefore be configured accordingly to observe the time course of the first and/or second inclination signals 113, 123 with regard to a drift, so as to compensate for any offset error and/or gain error that may result from the drift, or to output the sensor signal which has no drift as the corrected inclination signal 132.

In the evaluation of the two sensor signals 113 and 123 by the calculating unit 130, it is therefore advantageous to observe a change in temperature in the area of the sensors 110 and 120 over a corresponding time period, for example within a range of a few seconds up to a few minutes, before making a decision as to which of the two sensor signals 113 and 123 may be output and/or forwarded as the corrected sensor signal 132. To this end, one or more temperature sensors may be advantageously arranged in the vicinity of the sensors 110 and/or 120. The temperature values measured are taken into account in the evaluation of the two sensor signals 113 and 123, i.e., they influence the evaluation. The calculating unit 130 may therefore be suitably configured to determine the corrected inclination signal 132 while taking into account one or more temperature values of the one or more temperature sensors, and/or to correct the first, the second, and/or the corrected inclination signal(s) 132 as a function of the one or more temperature values. If the temperature has hardly or not at all changed, for example by less than 0.5 degree Celsius, in particular in the area of the thermodynamic sensor 120, and if the sensor signal 113 of the MEMS sensor 110 seems to be faulty or if there seems to be an abnormal behavior of the sensor 110, the calculating unit 130 may then output and/or forward the sensor signal 123 as the corrected sensor signal 132.

However, if the temperature has increased or decreased, e.g., by at least 1 degree Celsius, in particular in the area of the thermodynamic sensor 120, and if the sensor signal 113 seems to be faulty, or if there seems to be an abnormal behavior of the sensor 110, the calculating unit 130 cannot readily output and/or forward the sensor signal 123 as the corrected sensor signal 132. Now the calculating unit 130 will take further measures, such as compensating for the sensor signal 123 by means of a temperature curve stored in the memory. Said temperature curve may be determined, for example, when calibrating the sensor system 100, or is provided by the manufacturer of the sensor elements of the sensor 120. Once the sensor signal 123 has been compensated for accordingly, the calculating unit 130 may then output and/or forward the sensor signal 123 as the corrected sensor signal 132.

It goes without saying that the two sensor signals 113 and 123 are continuously verified and evaluated by the calculating unit 130—irrespective of which of the two sensor signals 113 or 123 is being output and/or forwarded as the corrected sensor signal 132—so as to increase the availability of the sensor system 100. If none of the two sensor signals 113 and 123 is to be categorized as reliable on the part of the calculating unit 130, for example because the sensor signal 113 seems to be faulty or because there is an abnormal behavior of the sensor 110 and because the ambient temperature is too high and there is an offset drift of the thermodynamic sensor 120 that cannot be compensated for, an alert should be output instead of a corrected sensor signal 132 in order to avoid damage to humans and to the machine.

Continuous and mutual verification and evaluation of the two sensor signals 113 and 123 by the calculating unit 130 may advantageously also be used for performing—in the event of a temperature change, in particular in the area of the thermodynamic sensor 120, e.g., by at least 1 degree Celsius—compensation for the sensor signal 123, provided that the sensor signal 113 of the MEMS sensor 110 does not seem to be faulty of that there does not seem to be any abnormal behavior of the sensor 110. The sensor signal 113, which is advantageous in terms of accuracy, may then be used, e.g., in addition to the compensation that has already been mentioned, by means of a temperature curve stored within the memory or also—provided that there is no temperature curve, for example—for sole compensation for a temperature drift of the thermodynamic sensor, i.e., for compensating for a drift of the sensor signal 123 that is caused by temperature changes. As was already described above, the calculating unit 130 may therefore be suitably configured to observe the time course of the first and/or second inclination signal(s) 113, 123 with regard to a drift so as to compensate for any offset error and/or gain error that may result from the drift.

In accordance with further embodiments, the two sensor signals may also be combined; depending on the deviation, e.g., respective weighting of each of the two sensor signals is mutually shifted.

Typical applications for the sensor system 100 will be explained below.

FIGS. 2a, 2b, 2c, and 2d each show an elevating platform comprising a chassis 20 and a superstructure 21 which is rotatably arranged thereon and has a telescopic jib 22 movably attached thereto. By means of a lifting cylinder 25 arranged at the superstructure 21 and at the telescopic jib 22, the telescopic jib 22 may be moved upward or downward. The telescopic jib 22 has further retractable and extendable steps 24 located thereat, in the example shown in FIGS. 1 and 2, two steps are provided. A working cage 23 is movably attached to the last step of the telescopic jib 22 in such a manner that same is kept in the horizontal plane. By means of supports 28 and 29 laterally arranged at the chassis 20 of the elevating platform 10, the elevating platform 10 may be reliably placed on a foundation 80 in a stable manner.

Figure 5:
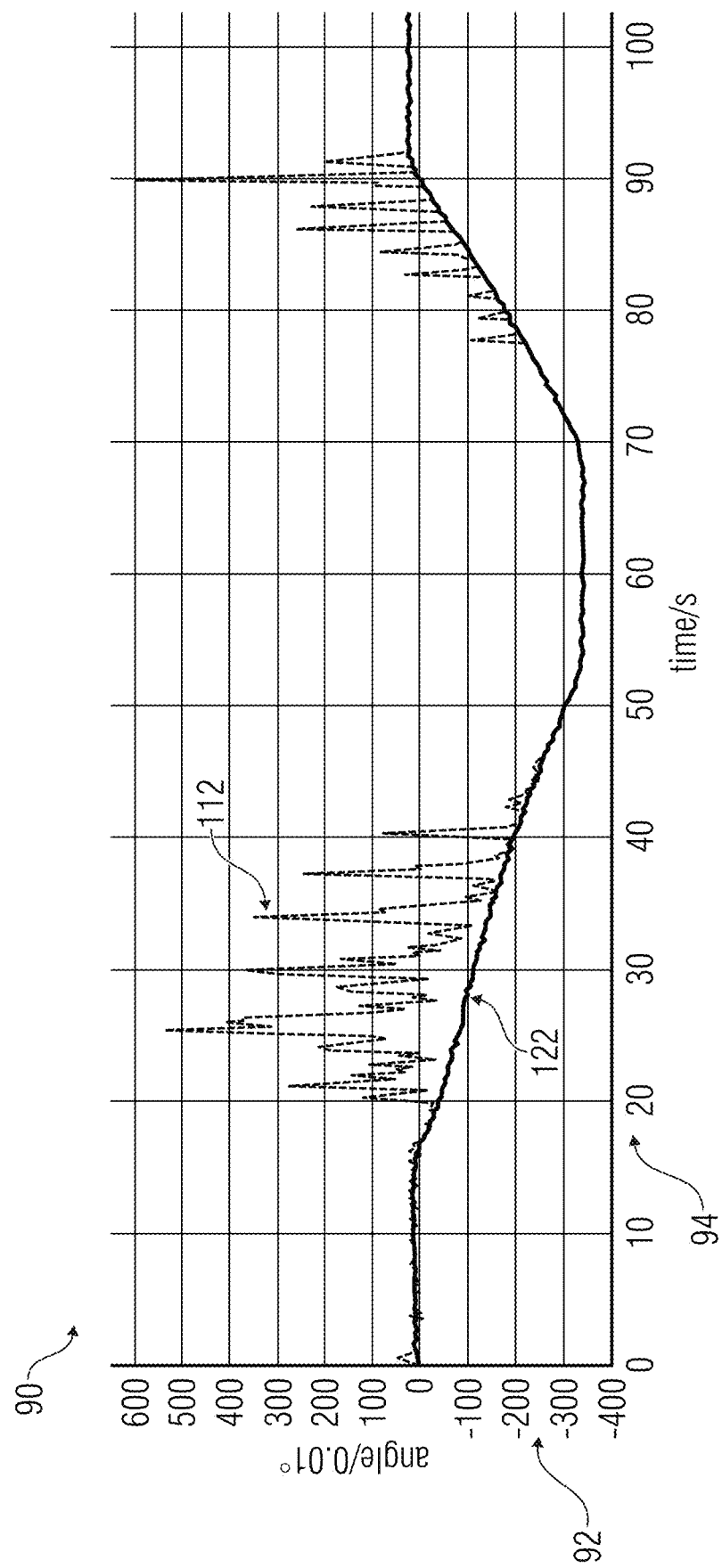
FIG. 5 shows a schematic diagram of the sensor signals belonging to the inclination system of FIG. 1.

FIG. 2b shows the superstructure 21 in a position that is rotated by 180° as compared to FIG. 2a. in practice, it is precisely in case of such a rotary movement 60 of the superstructure 21 that mechanical vibrations and/or interferences within the lower kHz range, i.e., approximately within the range from 3 to 4 kHz, are generated by the rotary drive, which vibrations and/or interferences act upon a sensor system arranged within the superstructure 21 and influence said sensor system to such an extent that deviations of measurement values occur without there being an actual change in the inclination of the elevating platform 10. Such vibrations or interferences acting on a sensor system are depicted in FIG. 5 and will be described in more detail below.

With the elevating platform 10 depicted here, the sensor system 100 for levelling the position of the elevating platform 10, which has been explained with reference to FIG. 1, may be installed, e.g., at the telescopic jib 22 or at the working cage 23 so as to determine the inclination of the telescopic jib 22 or of the working cage 23. Attachment to the superstructure 21 or to the chassis 20 would also be feasible in order to determine an inclination of the vehicle as compared to the plane 80. By using the improved sensor system 100 as compared to the inclination sensors which are otherwise typically used, one can ensure that the measurement will be highly precise and will exhibit low susceptibility to errors. The measurement signal 132 (cf. FIG. 1) would then be output by the calculating unit 130 on the basis of the sensor signals 113 and 123 of the sensors 110 and 120. The sensor signal 132 will then serve, e.g., as a levelling signal for a machine controller (not depicted) which be of overriding importance. As was already mentioned at the outset, the sensor system 100 is reduced in terms of production and purchase cost as compared to alternative inclination sensors.

Mechanical vibrations as have been found in a rotary movement 60 of the superstructure 21 are also possible during movement 61 of the telescopic jib 22 when the latter is moved upward or downward, as depicted in FIGS. 2c and 2d. This results in comparable mechanical vibrations and/or interferences, which are transferred to all of the components arranged at the mechanical system, such as a sensor system for position levelling, which is arranged at the superstructure 21. Such mechanical vibrations and/or interferences are caused, for example, by jerking of the cylinder during movement (retracting and/or extending of the push rod and/or piston rod), which is due to aging of the cylinder and of the sealings.

Even in the movements as are explained here with reference to FIGS. 2c and 2d, the sensor system 100 is characterized by increased reliability and availability.

Figure 4:
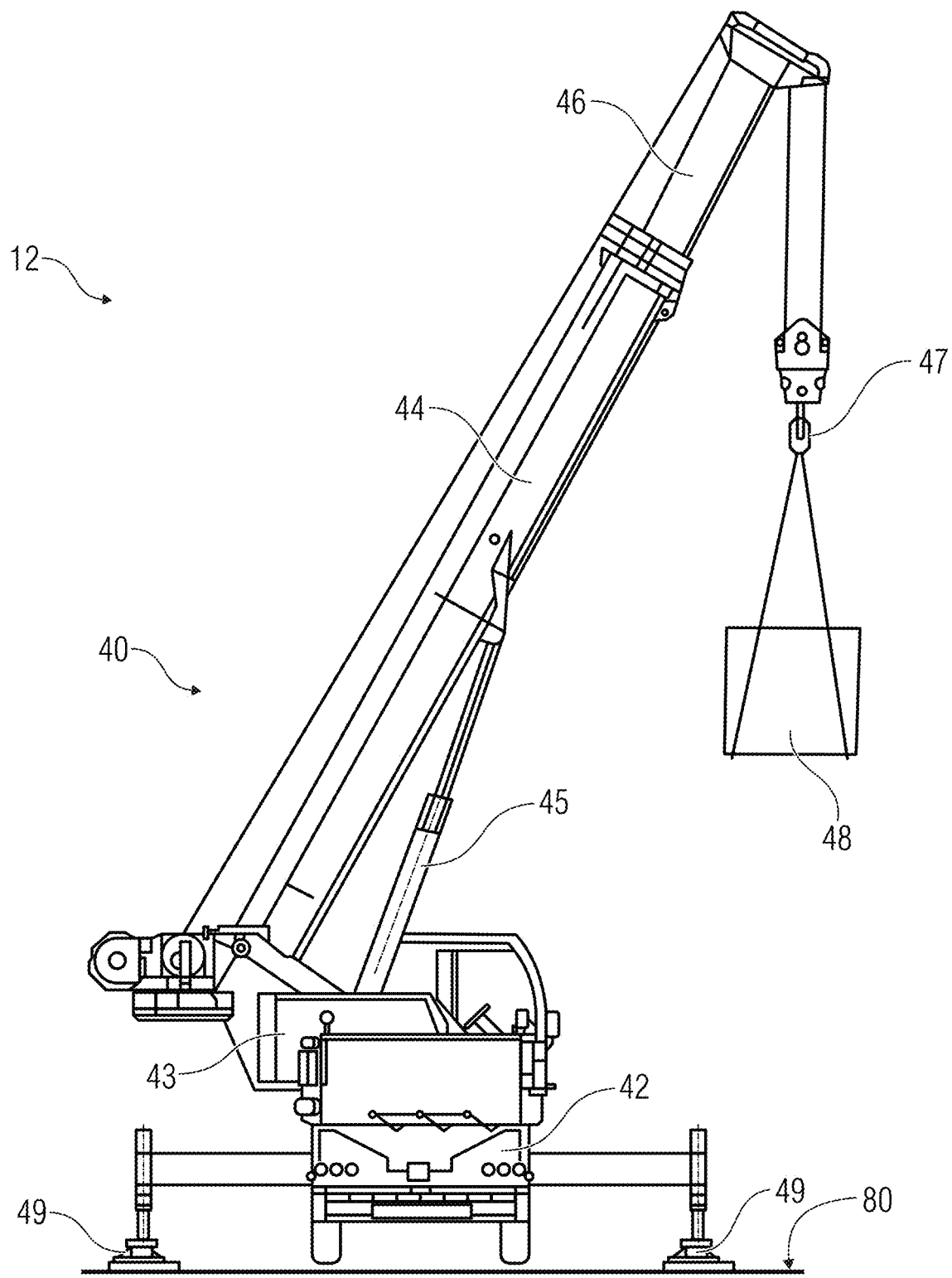

Further application examples of using the sensor system 100 will be set forth below with reference to FIGS. 3 and 4. FIGS. 3 and 4 depict further examples of machines where vibrations might be caused by problematic rotary drives and/or hydraulic cylinders which have aged and thus no longer operate without jerking. FIG. 3 shows a vehicle 11 having a loading crane 30 arranged on its chassis 32, which crane 30 consists of a rotatable superstructure 33 and of several telescopic jib steps 31. The last step of the telescopic jib 31 has a crane hook 37 attached to it by means of which loads 38 can be loaded and unloaded. The loading crane 30 is movable by means of hydraulic cylinders 35 and 36, i.e., the telescopic jib 31 may be moved downward or upward, for example, by retracting and extending the hydraulic cylinders 35 and 36.

FIG. 4 shows a mobile crane 12 having a superstructure 43 rotatably arranged on a chassis 42 of the mobile crane 12, the superstructure 43 having a crane arm 40 movably arranged thereat. The crane arm 40 essentially consists of a telescopic jib 44, which may be moved upward or downward, for example, by means of a lifting cylinder 45. In addition, the telescopic jib 44 consists of several steps 46, the last step of the telescopic jib 44 having a crane hook 47 arranged thereat for lifting loads 48.

Both in the vehicle 11 depicted in FIG. 3 and in the mobile crane 12 depicted in FIG. 4, the sensor system 100 may be used for enabling accurate and reliable inclination measurements at the individual components. Here, attachment takes place, again, both at the movable elements, such as at the telescopic jib step 31 and/or 44 at the crane arm 40. Of course, depending on the purpose of use, the sensor system may also be arranged at the chassis 32 and/or 42.

Now that the possible purposes of use of the sensor system 100 have been explained in detail, the sensor signals of the two inclination sensors 113 and 123 will be explained, with reference to FIG. 5, in terms of their behavior in the event of inclination and/or interference.

In a diagram 90, FIG. 5 shows measurement values that were output by a sensor system for position leveling during a rotational movement 60 by 90 degrees that is performed by the superstructure 21 of an elevating platform 10, as depicted, in principle, in FIGS. 2a, 2b. During the rotational movement and the measurement, the elevating platform 10 was laterally inclined by approx. 3.5 degrees since under these circumstances, the above-described mechanical vibrations and/or interferences caused by the rotary drive, might be manufactured readily and reproducibly. For the measurement, a sensor system 100 thus combined was specifically chosen so as to be able to compare the measurement results of both sensor technologies in this application.

In FIG. 5, these measurement results are depicted in the diagram 90 by means of two measurement-value curves 112 and 122. The measurement-value curve 112 shows the measurement values 113 output by a MEMS sensor 110, whereas the measurement value curve 122 shows the measurement values 123 output by a thermodynamic sensor 120. The inclination angle is plotted on the Y axis 92, and the time is plotted on the X axis 94. After approx. 15 seconds, a first rotational movement of the superstructure 21 with a rotational angle of approx. 90 degrees begins to take place in relation to the chassis 20. This rotational movement is stopped after about 40 seconds, and the superstructure 21 remains in the lateral position for approx. 15 seconds before it is moved back into the starting position (rotation by 90 degrees). It can clearly be seen that the measurement curve 112 of the MEMS sensor 110 exhibits heavy fluctuations, i.e., the above-described mechanical vibrations and/or interferences act directly upon the MEMS sensor 110 and are reflected in the output measurement value signal 113 (measurement value curve 112). However, with the thermodynamic sensor 120, no fluctuations in the measurement value curve 122 can be detected. In this context, the above-described mechanical vibrations and/or interferences do act upon the sensor 120 but have no impact on the measurement behavior of the sensor, i.e., said sensor is not influenced at all.

Even if it was assumed, in above embodiments, that the sensors 110 and 120 are a MEMS sensor, in particular, a MEMS sensor based on surface MEMS technologies, and a thermodynamic sensor, it shall be noted at this point that other combinations of MEMS sensors and a further sensor are also possible. As an additional MEMS sensor, the MEMS sensor in the above-described bulk-micromachined technology may be taken into account. As was already described, said sensors are filled with a gas, which is why they can hardly or not at all be made to resonate since the natural frequency (resonant frequency) of the sensor element is clearly above its cutoff frequency. It shall be noted here that any combination of these two MEMS technologies may also be looked at as a variation of an embodiment. Instead of a thermodynamic sensor, a liquid sensor might alternatively be used. With a liquid sensor, an inclination is detected by reflection or refraction of a beam of light by the liquid level or by a resistance measurement and/or capacitance measurement as a function of the location of the liquid.

With regard to FFT analysis, it shall be noted that same may be performed as follows in accordance with embodiments: for example, the measured first inclination sensor signal (of the MEMS sensor) is coupled out by means of hardware in two ways:
1. In a first way, only the direct component (direct-current component), i.e., the pure inclination signal, is filtered out, and thus, the amplitude of this signal is determined.
2. In a second way, all alternating components (alternating-current components) are filtered out, and the amplitude of this signal is integrated, so that what is determined is the so-called peak level (maximum amplitude) of the alternating components. Thus, the proportion of the respective signal components (DC and AC components) is determined.

Subsequently, the determined amplitudes of both signal components (direct-current and alternating-current components) are added and, thus, an overall amplitude is determined which consists of the pure inclination signal amplitude and of the amplitude of the interfering components (alternating components, or alternating-current components). If the overall amplitude is larger than the maximum workable control range (measurement range) of the inclination sensor, the second inclination signal will be used as the corrected inclination signal. In the event that the overall amplitude is too high, i.e., that the workable control range or a predefined measurement range having defined linearity error limits is exceeded, the second inclination signal will be used as the corrected inclination signal.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described in connection with or as a method step also represent a description of a corresponding block or detail or feature of a corresponding device. Some or all of the method steps may be performed by a hardware device (or while using a hardware device) such as a microprocessor, a programmable computer or an electronic circuit, for example. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU) or a graphics card (GPU), or may be a hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Inclination sensor system for a mobile work machine in the form of an elevating platform or of a crane or a turntable ladder, comprising:
a MEMS inclination sensor configured to output a first inclination signal on the basis of an inclination that exists at the inclination sensor;
a further inclination sensor of a different type that is configured to output a second inclination signal on the basis of the inclination that exists at the further inclination sensor; and
a fusion device configured to determine or calculate a corrected inclination on the basis of the first and second inclination signals and to output the corrected inclination as a corrected inclination signal,
wherein at least the MEMS inclination sensor and the further inclination sensor are arranged within a shared housing of the inclination sensor system, or wherein the MEMS inclination sensor and the further inclination sensor are coupled to each other in terms of their respective movements, and
wherein the further inclination sensor comprises a thermodynamic inclination sensor or an inclination sensor on the basis of a sensor principle that is robust toward slip-stick effects.

2. Inclination sensor system as claimed in claim 1, wherein the MEMS inclination sensor is manufactured on the basis of surface MEMS technologies.

3. Inclination sensor system as claimed in claim 2, wherein the MEMS inclination sensor comprises one or more layers which have been grown onto a substrate and have the MEMS structure introduced therein, and/or wherein the MEMS inclination sensor comprises a substrate which has the MEMS structures formed on its surface.

4. Inclination sensor system as claimed in claim 1, wherein the fusion device is configured to compare the first and second inclination signals and to output, in the event that there are no deviations, the first inclination signal as the corrected inclination signal.

5. Inclination sensor system as claimed in claim 1, wherein the fusion device is configured to compare the first and second inclination signals and to output, in the event that there are deviations, the second inclination signal as the corrected inclination signal.

6. Inclination sensor system as claimed in claim 1, wherein the fusion device is configured to verify the first inclination signal by means of an FFT and to output the second inclination signal as the corrected inclination signal in the event that a deviation within the frequency spectrum is detected or in the event that a predetermined level of one or more frequency components is exceeded.

7. Inclination sensor system as claimed in claim 1, wherein the fusion device is configured to verify a time course of the first inclination signal with regard to discontinuities and, in the event of discontinuities, to output the second inclination signal as the corrected inclination signal.

8. Inclination sensor system as claimed in claim 1, wherein the fusion device is configured to detect, in a time course of the first inclination signal, value peaks which exhibit a signal change by at least 0.1%, 0.5%, 2%, 5%, or 10% as compared to the previous level within a time period of less than 100 ms, 500 ms, or smaller than 1 second, and, in the event of value peaks being present, to output the second inclination signal as the corrected inclination signal.

9. Inclination sensor system as claimed in claim 1, wherein the fusion device is configured to verify the time course of the first inclination signal with regard to a characteristic curve, which exhibits a rising first inclination signal with subsequent plateau formation at a maximum value for the first sensor signal, and to output the second inclination signal as the corrected inclination signal in the event of said characteristic curve being present.

10. Inclination sensor system as claimed in claim 1, wherein the fusion device is configured to observe the time course of the first and/or second inclination signals with regard to a drift so as to compensate for any offset error and/or gain error that may result from the drift, or to output the sensor signal which exhibits no drift as the corrected inclination signal.

11. Inclination sensor system as claimed in claim 1, wherein the sensor system comprises one or more temperature sensors for monitoring the ambient temperature of the MEMS inclination sensor and/or of the further inclination sensor, the fusion device being configured to determine the corrected inclination signal while taking into account one or more temperature values of the one or more temperature sensors and/or to correct the first, the second, and/or the corrected inclination signal as a function of the one or more temperature values.

12. Work machine comprising an inclination sensor system as claimed in claim 1.

13. Work machine as claimed in claim 12, the work machine being an elevated platform or a crane or a turntable ladder.

14. Work machine as claimed in claim 12, wherein the inclination sensor system is arranged at a superstructure, a jib, a telescopic jib, or a working platform.

15. Method of measuring inclination in a mobile work machine, comprising:
determining an inclination that exists at the inclination sensor by means of a MEMS inclination sensor, and outputting a first inclination signal as a function of said inclination;
determining the inclination that exists at the inclination sensor by means of a further inclination sensor of a different type, and outputting a second inclination signal as a function of the inclination that exists at the inclination sensor; and
determining or calculating a corrected inclination on the basis of the first and second inclination signals so as to output a corrected inclination signal,
wherein at least the MEMS inclination sensor and the further inclination sensor are arranged within a shared housing of an inclination sensor system, or wherein the MEMS inclination sensor and the further inclination sensor are coupled to each other in terms of their respective movements, and wherein the further inclination sensor comprises a thermodynamic inclination sensor or an inclination sensor on the basis of a sensor principle that is robust toward slip-stick effects.

16. A non-transitory digital storage medium having a computer program stored thereon to perform the method of measuring inclination in a mobile work machine, said method comprising:

determining an inclination that exists at the inclination sensor by means of a MEMS inclination sensor, and outputting a first inclination signal as a function of said inclination;

determining the inclination that exists at the inclination sensor by means of a further inclination sensor of a different type, and outputting a second inclination signal as a function of the inclination that exists at the inclination sensor; and determining or calculating a corrected inclination on the basis of the first and second inclination signals so as to output a corrected inclination signal, when said computer program is run by a computer, wherein at least the MEMS inclination sensor and the further inclination sensor are arranged within a shared housing of an inclination sensor system, or wherein the MEMS inclination sensor and the further inclination sensor are coupled to each other in terms of their respective movements, and wherein the further inclination sensor comprises a thermodynamic inclination sensor or an inclination sensor on the basis of a sensor principle that is robust toward slip-stick effects.

17. Inclination sensor system for a mobile work machine in the form of an elevating platform or of a crane or a turntable ladder, comprising:

a MEMS inclination sensor configured to output a first inclination signal on the basis of an inclination that exists at the inclination sensor;

a further inclination sensor of a different type comprising a different sensor principle that is configured to output a second inclination signal on the basis of the inclination that exists at the further inclination sensor; and a fusion device configured to determine or calculate a corrected inclination on the basis of the first and second inclination signals and to output the corrected inclination as a corrected inclination signal;

wherein the fusion device is configured to compare the first and second inclination signals and to output the first inclination signal as the corrected inclination signal in the event that there are no deviations; and/or wherein the fusion device is configured to compare the first and second inclination signals and to output the second inclination signal as the corrected inclination signal in the event that there are deviations, wherein at least the MEMS inclination sensor and the further inclination sensor are arranged within a shared housing of the inclination sensor system, or wherein the MEMS inclination sensor and the further inclination sensor are coupled to each other in terms of their respective movements, and wherein the further inclination sensor comprises a thermodynamic inclination sensor or an inclination sensor on the basis of a sensor principle that is robust toward slip-stick effects.

18. Work machine comprising an inclination sensor system as claimed in claim 17.

19. Work machine comprising an inclination sensor system, said work machine being an elevating platform or a crane or a turntable ladder, the inclination sensor system being arranged at a superstructure, a jib, a telescopic jib, or a working platform, wherein said inclination sensor system comprises:

a MEMS inclination sensor configured to output a first inclination signal on the basis of an inclination that exists at the inclination sensor;

a further inclination sensor of a different type comprising a different sensor principle that is configured to output a second inclination signal on the basis of the inclination that exists at the further inclination sensor; and a fusion device configured to determine or calculate a corrected inclination on the basis of the first and second inclination signals and to output the corrected inclination as a corrected inclination signal, wherein at least the MEMS inclination sensor and the further inclination sensor are arranged within a shared housing of the inclination sensor system, or wherein the MEMS inclination sensor and the further inclination sensor are coupled to each other in terms of their respective movements and wherein the further inclination sensor comprises a thermodynamic inclination sensor or an inclination sensor on the basis of a sensor principle that is robust toward slip-stick effects.

20. Method of measuring inclination in a mobile work machine, comprising:

determining an inclination that exists at the inclination sensor by means of a MEMS inclination sensor, and outputting a first inclination signal as a function of said inclination;

determining the inclination that exists at the inclination sensor by means of a further inclination sensor of a different type comprising a different sensor principle, and outputting a second inclination signal as a function of the inclination that exists at the inclination sensor;

determining or calculating a corrected inclination on the basis of the first and second inclination signals so as to output a corrected inclination signal; and comparing the first and second inclination signals and outputting the first inclination signal as the corrected inclination signal in the event that there are no deviations; and/or comparing the first and second inclination signals and outputting the second inclination signal as the corrected inclination signal in the event that there are deviations, wherein at least the MEMS inclination sensor and the further inclination sensor are arranged within a shared housing of an inclination sensor system, or wherein the MEMS inclination sensor and the further inclination sensor are coupled to each other in terms of their respective movements, and wherein the further inclination sensor comprises a thermodynamic inclination sensor or an inclination sensor on the basis of a sensor principle that is robust toward slip-stick effects.

21. A non-transitory digital storage medium having a computer program stored thereon to perform the method of measuring inclination in a mobile work machine, said method comprising:

determining an inclination that exists at the inclination sensor by means of a MEMS inclination sensor, and outputting a first inclination signal as a function of said inclination;

determining the inclination that exists at the inclination sensor by means of a further inclination sensor of a different type comprising a different sensor principle, and outputting a second inclination signal as a function of the inclination that exists at the inclination sensor;

determining or calculating a corrected inclination on the basis of the first and second inclination signals so as to output a corrected inclination signal; and comparing the first and second inclination signals and outputting the first inclination signal as the corrected inclination signal in the event that there are no deviations; and/or comparing the first and second inclination signals and outputting the second inclination signal as the corrected inclination signal in the event that there are deviations, when said computer program is run by a computer, wherein at least the MEMS inclination sensor and the further inclination sensor are arranged within a shared housing of an inclination sensor system, or wherein the MEMS inclination sensor and the further inclination sensor are coupled to each other in terms of their respective movements, and wherein the further inclination sensor comprises a thermodynamic inclination sensor or an inclination sensor on the basis of a sensor principle that is robust toward slip-stick effects.

\* \* \* \* \*